US005432856A

United States Patent [19]

Shioda

[11] Patent Number: 5,432,856

[45] Date of Patent: Jul. 11, 1995

[54] SOUND EFFECT-CREATING DEVICE

[75] Inventor: Kazuaki Shioda, Shizuoka, Japan

[73] Assignee: Kabushiki Kaisha Kawai Gakki Seisakusho, Shizuoka, Japan

[21] Appl. No.: 127,354

[22] Filed: Sep. 28, 1993

[30] Foreign Application Priority Data

Sep. 30, 1992 [JP] Japan .................................. 4-285125
Oct. 20, 1992 [JP] Japan .................................. 4-306343

[51] Int. Cl.$^{6}$ ................................................ H03G 3/00
[52] U.S. Cl. ....................................................... 381/63
[58] Field of Search ................................ 381/63, 17, 1

[56] References Cited

U.S. PATENT DOCUMENTS 3,684,835 8/1972 Orban .................................... 381/63
4,625,326 11/1986 Kitzen et al. ......................... 381/63

*Primary Examiner*—Forester W. Isen
*Attorney, Agent, or Firm*—Evenson, McKeown, Edwards & Lenahan

[57] ABSTRACT

A sound effect-creating device adds a reverberation tone signal to a monaural original tone signal by the use of a reverberation circuit, and delays a monaural reverberation tone signal output from the reverberation circuit by different delay amounts by the use of a plurality of delay circuits. At least one of delayed monaural reverberation tone signals from the delay circuits and the monaural reverberation tone signal are added up by a plurality of mixing circuits, and the resulting signals are delivered therefrom. The plurality of delay circuits are each constructed such that a delayed monaural reverberation tone signal output from one of the delay circuits and/or one from another of the delay circuits is/are input to the one of the delay circuits.

17 Claims, 7 Drawing Sheets

SOUND EFFECT-CREATING DEVICE

BACKGROUND OF THE INVENTION

1. Field of the Invention

This invention relates to a sound effect-creating device for electronic musical instruments and the like, and more particularly to a sound effect-creating device for adding a reverberation signal to a monaural original tone signal, delaying the resulting monaural reverberation tone signal by respective desired time periods by means of a plurality of delay circuits selected by a player or operator, and combining the resulting delayed monaural reverberation tone signals as desired, to impart a reverberation effect for creating impressions of a spread of a sound and the like to the monaural original tone signal.

2. Prior Art

In electronic musical instruments, such as electronic pianos and other electronic keyboard instruments, an artificial musical tone in an audio frequency range, which corresponds to a key of the keyboard selectively depressed by a player, is synthesized by electronic computation. In such electronic synthesis, the artificial musical tone is not only synthesized in a desired tone color and tone quality, but also often imparted with various sound effects produced according to settings selectively made for control thereof by the player via switches, volume knobs, and the like of the instrument. The sound effect includes a reverberation which additionally creates an impression of a spread of a sound on listeners. This effect of reverberation makes the listeners feel as if they were listening to a player playing the electronic instrument in a concert hall. Therefore, in the field of the electronic musical instruments, how to create the impression of a spread of a sound and the like is a very important technique in designing an instrument.

FIG. 1 shows a conventional sound effect-creating device of this kind. The sound effect-creating device, generally designated by reference numeral 81, comprises a monaural original tone signal-mixing circuit 82, a reverberation circuit 83, a delay circuit 84, mixing circuits 85, 86, and amplitude control circuits 87 to 94.

The monaural original tone signal-mixing circuit 82 adds up stereophonic original tone signals to form a monaural original tone signal. The circuit 82 has input terminals 82*a*, 82*b* connected, via the amplitude control circuits 87, 88 for controlling the amplitudes (or volumes) of stereophonic original tone signals, to a left channel 95 and a right channel 96, respectively. It also has an output terminal 82*c* connected to an input terminal of the reverberation circuit 83.

The reverberation circuit 83 adds a reverberation tone signal to the monaural original tone signal to form a monaural reverberation tone signal. This circuit 83 has an output block which bifurcates into Paths, one of which is connected via an amplitude control circuit 89 to an input terminal of the delay circuit 84, and the other of which is connected via an amplitude control circuit 90 to input terminals of respective amplitude control circuits 92, 94. The delay circuit 84 delays the monaural reverberation tone signal by a predetermined time period, and has an output terminal connected to input terminals of respective amplitude control circuits 91, 93.

The mixing circuits 85, 86 add up the delayed monaural reverberation tone signal and the monaural reverberation tone signal to form stereophonic signals, which are delivered to the left and right channels 97, 98, respectively. The mixing circuit 85 has input terminals connected to output terminals of the amplitude control circuits 91, 92, and an output terminal connected to the left channel 97, while the mixing circuit 86 has input terminals connected to output terminals of respective amplitude control circuits 93, 94, and an output terminal connected to the right channel 98.

The left and right channels 97, 98 are connected via arithmetic circuits, digital-to-analog converters, and audio amplifiers, to left and right loudspeakers, neither of which are shown, respectively.

The sound effect-creating device 81 adds up the stereophonic original tone signals to form the monaural original tone signal, and then adds the reverberation tone signal to the monaural original tone signal, to form the monaural reverberation tone signal. The monaural reverberation tone signal and the delayed monaural reverberation signal are each supplied to bifurcated paths, and controlled to predetermined amplitudes by the respective amplitude circuits to form four signals. These signals, are added up in selected combinations thereof to form stereophonic tone signals which are capable of creating an impression of a spread of a sound. This method is based on the principle that when an original signal is delayed 50 to 100 msec., a tone produced by the resulting delayed signal can be timewise separated from a tone produced by the original signal.

More specifically, according to the sound effect-creating device 81, the amplitude control circuits 87, 88 control the stereophonic signals input from the left and right channels 95, 96 to predetermined amplitudes, and the resulting signals are added up by the monaural original tone signal-mixing circuit 82 to form the monaural original tone signal. Then, the reverberation circuit 83 adds the reverberation tone signal having predetermined delay times to the monaural original tone signal, to form the monaural reverberation tone signal. The monaural reverberation tone signal is supplied into bifurcated paths, one of which is connected to the amplitude control circuit 89, where the signal is controlled to a predetermined amplitude, and then delivered to the delay circuit 84, and the other of which is connected to the amplitude control circuit 90, where the signal is controlled to a predetermined amplitude, and then further supplied to bifurcated paths connected to the amplitude control circuits 92, 94, where the signals transmitted via the bifurcated paths are controlled to predetermined amplitudes. The resulting signals controlled with respect to their amplitude are input to the mixing circuits 85, 86, respectively.

The delayed monaural reverberation tone signal output from the delay circuit 84 is supplied into bifurcated paths, one of which is connected to the amplitude control circuits 91, 93, where the signal is controlled to respective predetermined amplitudes, and then the resulting signals having controlled amplitudes are supplied to the mixing circuits 85, 86, respectively.

The mixing circuits 85, 86 add up combinations of the delayed monaural reverberation tone signals and the monaural reverberation tone signals, to deliver the resulting signals to the left and right channels 97, 98.

By virtue of the above process, the delayed monaural reverberation tone signals are timewise separated from the monaural reverberation tone signals, and have different characteristics from those of the monaural reverberation tone signals. A selected combination of these two kinds of signals are added up, and then delivered to the left and right channels 97, 98. The signals are then supplied via the digital-to-analog converters, etc., to the left and right loudspeakers, not shown, realizing a stereophonic sound which creates an impression of a wider spread of sound than the stereophonic original sound.

However, such a conventional sound effect-creating device suffers from the following problems: By nature, stereophonic sounds echo back in various manners in an architecture, and the spread of a sound varies with the lapse of time. However, tile conventional device can only impart a rather simple reverberation to the original sound. That is, according to this device, the stereophonic original tone signals are added up, and then reverberation tone signal is simply added to the resulting monaural signal, followed by preparing the timewise separated signal therefrom, and adding up the monaural reverberation signals and the timewise separated signals controlled in amplitude in selected combinations, to impart to the original sound the effect of creating the impression of a spread of a sound on listeners. Therefore, a sound image resulting from the monaural reverberation tone signals is localized at a position determined by the amplitudes of the monaural reverberation tone signals delivered to the left and right channels, respectively. Then, after the lapse of the delay time; the sound image is shifted to a position determined by the amplitudes of the delayed monaural reverberation tone signals. Therefore, the localization of the sound image changes in a relatively simple manner, and hence it is impossible to create the effect of a sufficient spread of a sound which varies with the lapse of time. Further, the device can only provide a combination of the monaural reverberation tones and the delayed monaural reverberation tones, so that variation in reverberation of the sound obtained thereby is not sufficient.

Further, the components of the sound produced from the left and right loudspeakers connected via the audio amplifiers to the left and right channels are only two kinds, i.e. the monaural reverberation tone and the delayed monaural reverberation tone, and hence there is not sufficient thickness of the sound.

SUMMARY OF THE INVENTION

It is an object of the invention to provide a sound effect-creating device which is capable of imparting to a sound an effect of diversified variation in the spread and reverberation of the sound.

It is a further object of the invention to provide a sound effect-creating device which is capable of imparting to a sound an effect of sufficiently-amplified thickness as well as diversified variation in the spread and reverberation of the sound.

To attain the above objects, the present invention provides a sound effect-creating device for imparting a sound effect to a sound, which comprises:

a reverberation circuit for adding a reverberation tone signal to a monaural original tone signal to form a monaural reverberation tone signal;

a plurality of delay circuits for delaying the monaural reverberation tone signal output from the reverberation circuit by respective different delay amounts to form delayed monaural reverberation tone signals; and a plurality of mixing circuits for adding up at least one of the delayed monaural reverberation tone signals and the monaural reverberation tone signal;

wherein each of the plurality of delay circuits is constructed such that a delayed monaural reverberation tone signal output from the each of the plurality of delay circuits and/or a delayed monaural reverberation tone signal output from another of the plurality of delay circuits is/are supplied to the each of the plurality of delay circuits.

According to the sound effect-creating device of the invention, after adding the reverberation tone signal to the monaural original tone signal, the resulting signal is delayed by the plurality of delay circuits by the respective different delay amounts, and then the resulting delayed signal(s) and the signal which is not delayed are added up to form stereophonic tone signals. Therefore, the sound images obtained based on the non-delayed signal and the plurality of delayed signals which are timewise separated from the non-delayed signal and each other are localized such that they shift their positions with lapse of time, giving an impression of diversified variation of the spread of the sound.

Further, since an output from at least one of a plurality of delay circuits is input to each delay circuit, the thickness of reverberation tone signals increases with the lapse of time, which provides a diversified variation in the reverberation of the sound. Further, since an output from each delay circuit having a different delay amount is supplied to an input of another delay circuit, a plurality of reverberation tone signals are delivered at first which are timewise separated from each other in a manner corresponding to the delay amounts of the respective delay circuits, and as time elapses, the output signals from the plurality of delay circuits are influenced by each other to converge an output from the mixing circuit while repeating reverberation at intervals of a fixed delay time, so that separation of reverberation tone signals cease to occur. Accordingly, the sound images are localized such that they shift their positions as time elapses, to change the spread of the sound in a further diversified manner.

Preferably, the plurality of mixing circuits each has a plurality of amplitude control circuits for controlling the amplitudes of the delayed monaural reverberation tone signals input thereto, respectively.

Preferably, the reverberation circuit has a monaural original tone signal-mixing circuit arranged at an input block thereof for adding up original tone signals of a plurality of channels to form the monaural original tone signal.

Further preferably, the monaural original tone signal-mixing circuit has a plurality of amplitude control circuits for controlling the amplitude of each of the original tone signals of the plurality of channels.

Preferably, at least one of the plurality of mixing circuits inverts the sign of a value of amplitude of at least one of the delayed monaural reverberation tone signals and then adds the resulting signal to the monaural reverberation tone signal.

According to this preferred embodiment, the signal output from each mixing circuit contains a signal component having the sign of a value of amplitude inverted and a signal component having the sign of a value of amplitude not inverted, and these signal components have different characteristic due to different phases thereof. Therefore, the output signals from the plurality of mixing circuits contain signal components having characteristics even more diversified in variation, which makes it possible to create a sound having more thickness.

More preferably, at least one of the plurality of amplitude control circuits of the plurality of mixing circuits inverts the sign of a value of amplitude of the delayed reverberation tone signal input thereto and then delivers the resulting signal to one of the plurality of mixing circuits associated therewith.

The above and other objects, features, and advantages of the invention will become more apparent from the following detailed description taken in conjunction with the accompanying drawings.

DETAILED DESCRIPTION

The invention will now be described in detail with reference to drawings showing a preferred embodiment thereof.

First, the construction of a sound effect-creating device according to the preferred embodiment will be described. In the present embodiment, a microcomputer (hereinafter referred to as "the CPU"), not shown, is used to perform digital processing of signals with the aid of software. Therefore, for tile sake of convenience of explanation, the concept of construction of the sound effect-creating device will be described with reference to FIG. 2.

Figure 1:
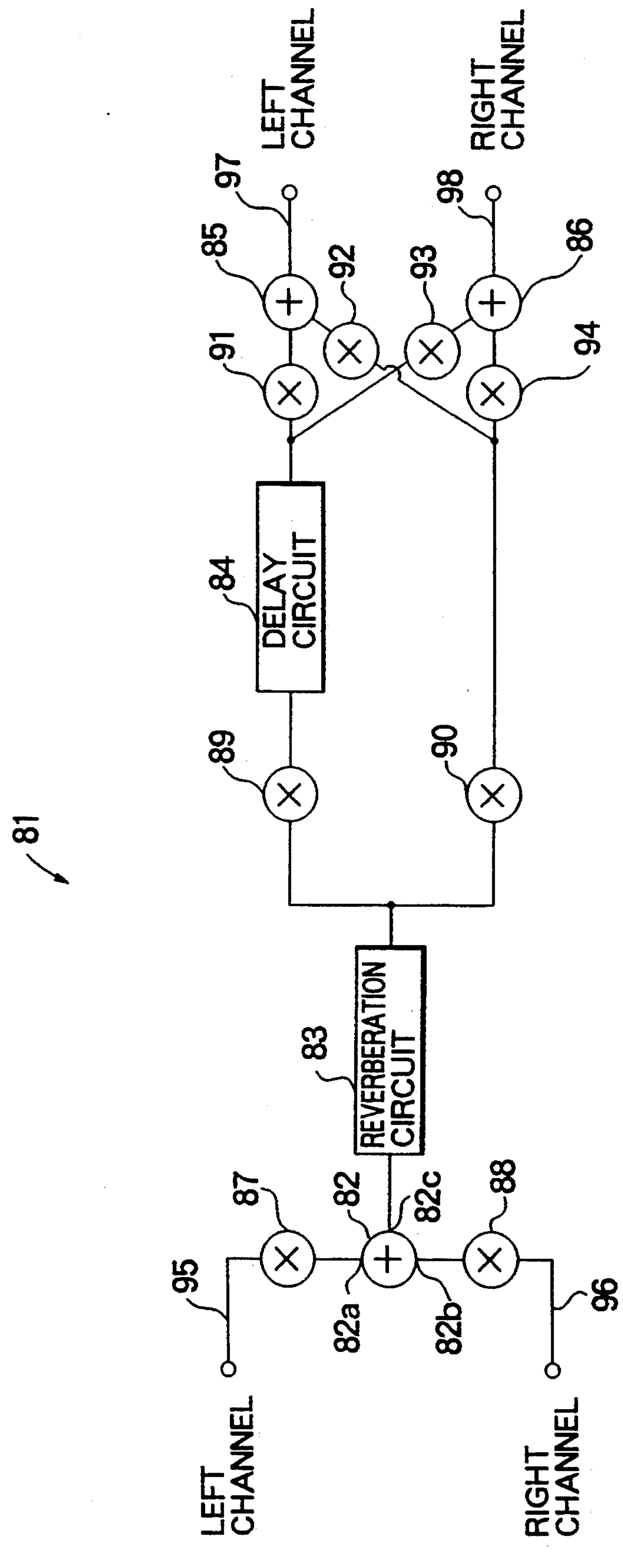
FIG. 1 PRIOR ART
FIG. 1 is a circuit diagram showing a conventional sound effect-creating device.
Figure 2:
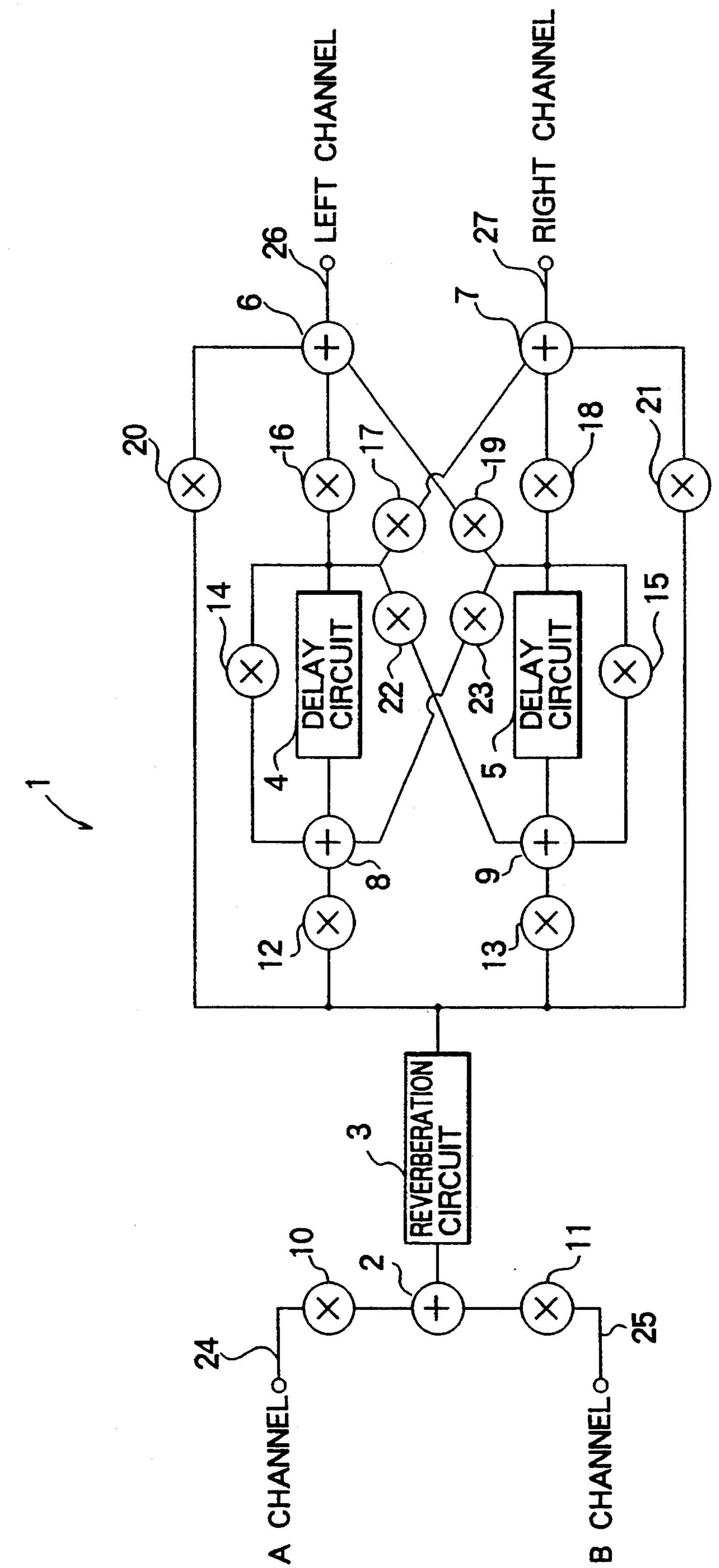
FIG. 2 is a conceptual representation of construction of a sound effect-creating device according to a preferred embodiment of the invention.

In FIG. 2, reference numeral 1 generally designates the sound effect-creating device according to the preferred embodiment, which comprises a monaural original tone-mixing circuit 2, a reverberation circuit 3, delay circuits 4 and 5, mixing circuits 6 and 7, feedback mixing circuit 8 and 9, and amplitude control circuits 10 to 23.

The monaural original tone-mixing circuit 2 forms a monaural original tone signal, by adding up stereophonic original tone signals input thereto via A and B channels 24 and 25. The circuit 2 has input terminals thereof connected via the amplitude circuits 10 and 11 and the A and B channels 24, 25 to an output block of an electronic musical instrument, not shown, to receive the stereophonic original tone signals artificially produced by the electronic musical instrument in a manner corresponding to a key of a keyboard, not shown. This circuit 2 has an output terminal connected to an input terminal of the reverberation circuit 3. The amplitude control circuits 10 and 11 controls amplitudes of the signals input thereto. When a player selects a coefficient which is, though not particularly limited, e.g. in a range of 0 to 1, as a control amount, the control circuit multiplies the amplitude of an input signal by the coefficient to thereby determine the amplitude of the output signal from the amplitude control circuit. The amplitude control circuits 12 to 23, referred to hereinafter, also operate in the same manner.

The reverberation circuit 3 adds a reverberation tone signal to the monaural original tone signal to form a monaural reverberation tone signal, and incorporates sixteen delay circuits, with an output block thereof branching into four paths connected to the input terminals of the amplitude control circuits 12, 13, 20, and 21, respectively.

The delay circuits 4 and 5 form delayed monaural reverberation tone signals from the monaural reverberation tone signal. The delay circuit 4 has an input terminal connected via the feedback mixing circuit 8 to an output terminal of each of the amplitude control circuits 12, 14, and 23, and an output terminal connected to an input terminal of each of the amplitude control circuits 14, 16, 17, and 22. The delay circuit 5 has an input terminal connected via the feedback mixing circuit 9 to an output terminal of each of the amplitude control circuits 13, 15, and 22, and an output terminal connected to an input terminal of each of the amplitude control circuits 15, 18, 19 and 23. In this connection, delay amounts effected by the delay circuits 4 and 5 can be set as desired by the player, by operating delay amount-setting switches provided on the electronic musical instrument, not shown.

The mixing circuits 6 and 7 add up respective combinations of delayed monaural reverberation tone signals of two kinds with different delay times, and the monaural reverberation tone signal. The mixing circuit 6 has input terminals connected to output terminals of the amplitude control circuits 16, 19, and 20, respectively, and an output terminal connected to a left channel 26 for a stereophonic signal, while the mixing circuit 7 has input terminals connected to output terminals of the amplitude control circuits 17, 18, and 21, respectively, and an output terminal connected to a right channel 27 for a stereophonic signal. The left and right channels 26 and 27 are connected via arithmetic circuits, digital-to-analog converters, and audio amplifiers, to left and right loudspeakers, neither of which are shown, for producing a stereophonic sound.

Figure 3:
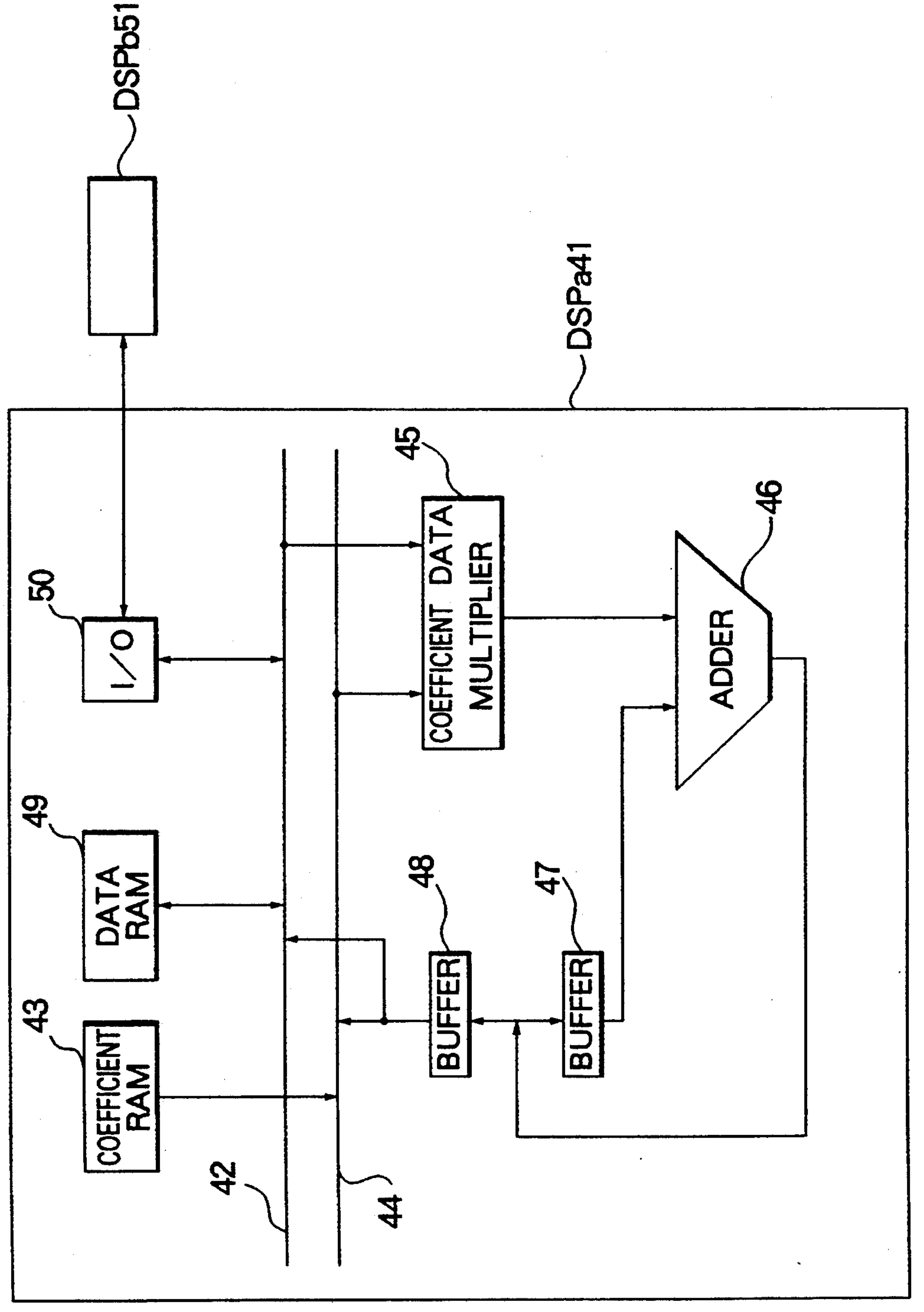
FIG. 3 is a block diagram showing the configuration of a digital signal processor (DSP) used for the sound effect-creating device according to the preferred embodiment.

Next, the operation of the sound effect-creating device 1 of the present embodiment will be described in detail with reference to FIG. 2 and FIG. 3. FIG. 2 shows the construction of a DSP (Digital Signal Processor) which implements the sound effect-creating device 1 shown in FIG. 2, according to the present embodiment. The DSP is comprised, though not particularly limited, of two DSP's (DSPa 41 and DSPb 51) each having a completely identical construction. Therefore, FIG. 3 shows details of the construction of the DSPa as a representative of the two, and hereafter, corresponding identical elements in each DSP will be designated by identical reference numerals. The DSPa 41 performs the operations of the monaural original tone signal-mixing circuit 2, and the reverberation circuit 3, while the DSPb 51 the operations of the delay circuits 4 and 5, and the mixing circuits 6 and 7. In addition, the DSPa 41 and DSPb 51 are connected to each other via an I/O (input/output device) 50 of each DSP by a data bus.

Figure 4:
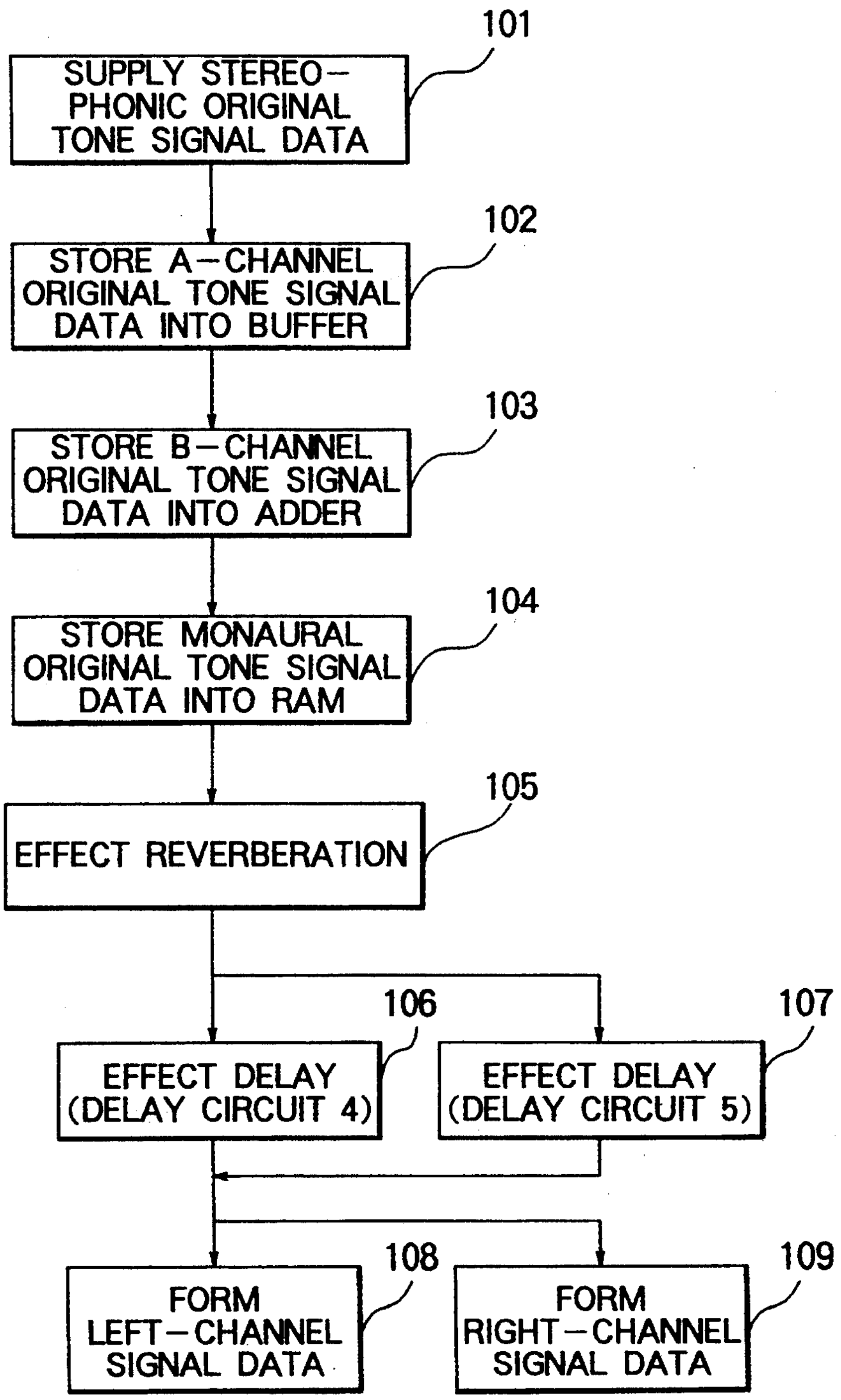
FIG. 4 is a flowchart of operation of the sound effect-creating device according to the embodiment.

Next, the operations of the DSPa 41 and DSPb 51 in FIG. 3 will be described in detail with reference to FIG. 4 showing a flowchart of the operations. All the operations are controlled by the CPU.

First, when a player depresses a key on the keyboard of the electronic musical instrument, such as an electronic piano, not shown, with switches or the like, not shown, selectively operated in a manner corresponding to a desired sound effect, the CPU reads data of stereophonic original tone signals each in the form of a digital signal formed of data pieces each having, though not particularly limited, e.g. 24 bits, from an original tone signal data RAM, not shown, and transmits them to the A and B channels 24, 25, by a predetermined repetition period, at a step 101. In this connection, the original sound data RAM is incorporated in a system controller, not shown, and stores data of the waveforms of original stereophonic sounds respectively corresponding to the keys of the keyboard.

Next, the mixing operation of the monaural original tone signal-mixing circuit 2 appearing in FIG. 2 adds up the stereophonic original tone signals to form a monaural original tone signal (steps 102 to 104). The steps 102 to 104 will now be described in detail.

The CPU reads a data piece of one of the stereophonic original tone signals of the A channel 24 from the original tone signal data RAM, and deposits same on a data bus 42. A multiplier 45 takes in the data piece of the original tone signal from the data bus 42, and temporarily stores it into an internal data register thereof, not shown. Then, according to a setting of an amplitude by the player, a coefficient data piece of 16 bits stored in a coefficient RAM 43 is read out and deposited on a coefficient bus 44. In this connection, a coefficient represented by the coefficient data piece is not particularly limited, but let it be assumed that it is set to a value of 1 in the present embodiment. The multiplier 45 stores the coefficient data piece into an internal coefficient register thereof, not shown, and multiplies the data piece of the original sound data already stored therein by the coefficient data piece. The data piece after multiplication is transferred via an adder 46 to a buffer 47 for storage therein (step 102).

Next, a data piece of one of the stereophonic original tone signals of the B channel 25 is input via the data bus 42 to the multiplier 45 in a manner similar to that described at the step 102, where the data piece is multiplied by a coefficient data piece indicative of a coefficient (let it be assumed that the coefficient has a value of 1 according to selection by the player similarly to the step 101), and the resulting data piece is stored into the adder 46 (step 103).

Then, the data piece of the stereophonic original tone signal of the A channel 24 already stored in the buffer 47 is input to the adder 46, where the two data pieces of the stereophonic original tone signals of the left and right channels 24, 25 are added up to form a data piece of a monaural original tone signal. This data piece is stored into a predetermined address location within a data RAM 49 via a buffer 48 (step 104). The adding-up operation of the monaural original tone signal-mixing circuit 2 appearing in FIG. 2 is completed by carrying out the operations described above at predetermined time intervals.

Next, the reverberation circuit 3 appearing in FIG. 2 forms data of a monaural reverberation tone signal having a reverberation time and amplitude as selected by the player, at a step 105, from the data of the monaural original tone signal formed at the step 104. More specifically, the first data piece of the monaural original tone signal stored in the data RAM 49 is deposited on the data bus 42 to input same into the multiplier 45. Then, a data piece of a coefficient corresponding to the selected amplitude level of the reverberation tone signal is read from the coefficient RAM 43 via the coefficient bus 44 into the multiplier 45. The multiplier 45 multiplies the data piece of the monaural original tone signal already stored therein by the data piece of the coefficient. The resulting data piece obtained by multiplication of the multiplier 45 is transferred via the adder 46 to the buffer 48 for storage therein, and at the same time via the data bus 42 to the data RAM 49 for storage therein. Thereafter, the data piece stored in the buffer 48 is multiplied by a data piece of a coefficient corresponding to a predetermined desired amplitude of the reverberation tone signal, and this operation is repeatedly carried out at predetermined intervals as many times as correspond to duration of reverberation, to thereby form data of the reverberation tone signal. This operation is repeatedly carried out on a sequence of data pieces of the monaural original tone signal to thereby complete the reverberation operation of the reverberation circuit 3 (step 105).

Next, the delay circuits 4 and 5 appearing in FIG. 2 delay the monaural reverberation tone signal by respective delay times selected by the player, by means of the DSPb 51 (steps 106 and 107). In the present embodiment, the delay amounts by the delay circuits 4 and 5, which are not particularly limited, are assumed to be set to 50 msec. and 100 msec., respectively. Since the delay circuit 5 operates in the same manner as the delay circuit 4, description of the operation of the delay circuit 5 will be omitted.

First, the data of the monaural reverberation tone signal stored in the data RAM 49 of the DSPa 41 are transferred via I/O's 50 to a data RAM 49 of the DSPb 51. A data piece of the data stored in the data RAM 49 of the DSPb 51 is supplied to a multiplier 45. A data piece of a coefficient corresponding to an amplitude control amount of the amplitude control circuit 12 is read from a coefficient RAM 43, into the multiplier 45, where the two data are multiplied by each other. The resulting data is transferred via an adder 46 and a buffer 48, as a first data piece of the delayed monaural reverberation tone signal to the data RAM 49 to be stored into a predetermined address location thereof.

When the above operation is repeated until a data piece of the monaural reverberation tone signal stored in the data RAM 49 corresponding to a time point after the lapse of a period of delay time, the first data piece of the delayed reverberation tone signal is read from the data RAM 49 into the multiplier 45, and a data piece of a coefficient (not particularly limited, but in the present embodiment, assumed to be equal to 0.5) selected by the operator, as an amplitude control amount (feedback control amount) of the amplitude control circuit 14, is read from the coefficient RAM 43 into the multiplier 45, where the two data pieces are multiplied by each other. The resulting data pieces are transferred via the adder 46 to the buffer 47 for temporary storage therein.

In addition, when the delayed monaural reverberation tone signal output from the delay circuit 5 is to be input via the feedback mixing circuit 8 to the input terminal of the delay circuit 4, the output data from the delay circuit 5 to be delivered from the sound effect-creating device with delay (50 msec.) from the data output from the delay circuit 4 corresponding to a difference in the delay amount between the delay circuits 4 and 5 is multiplied by a predetermined coefficient at the multiplier 45 in the same manner as described above, and then the resulting data piece is added by the adder 46 to the data piece read from the buffer 47, followed by the sum being stored into the buffer 47. The data thus obtained constitute a feedback amount of the delayed monaural reverberation tone signal input to the delay circuit 4 which is determined by the amplitude control circuits 14 and 23 appearing in FIG. 2.

Then, the data piece of the monaural reverberation tone signal corresponding to a time point after the lapse of the delay time of the delay circuit 4 is read from the data RAM 49 into the multiplier 45, where it is multiplied by the data piece of the coefficient corresponding to the amplitude control amount of the amplitude control circuit 12 as described above. The resulting data piece is delivered to the adder 46, where this data piece and the data piece stored in advance in the buffer 47 are added up, and the sum is stored into a predetermined address location of the data RAM 49 as a first data piece of the delayed monaural reverberation tone signal containing a primary feedback amount. This operation is carried out until there is obtained a data piece .of the delayed monaural reverberation tone signal containing the primary feedback amount corresponding to a time point after the lapse of another period of the delay time.

Then, when a data piece of the monaural reverberation tone signal corresponding to this time point after the lapse a twofold period of the delay time after the start of delaying process is to be processed, the first data piece of the delayed monaural reverberation tone signal containing the primary feedback amount is read from the data RAM 49 into the multiplier 45. Then, the same procedure described above is performed to obtain a first data piece of the delayed reverberation tone signal containing a secondary feedback amount, which is stored into the data RAM 49. This operation is carried out until there is obtained a data piece of the delayed monaural reverberation tone signal containing the secondary feedback amount corresponding to a time point after the lapse of another period of the delay time.

Thus, the operation of adding 50% of the output from the delay circuit, i.e. 50% of the delayed monaural reverberation tone signal to the monaural reverberation tone signal corresponding to a time point after the lapse of the delay time is sequentially repeated to cause a repetition of the monaural reverberation tone signal to be present in the delayed monaural reverberation tone signal.

In parallel with the above operation, the delayed monaural reverberation tone signal stored in the data RAM 49 is read out after the lapse of 50 msec. This means delivery of the delayed monaural reverberation tone signal from the delay circuit 4 (step 106). Similarly, the delay circuit 5 performs delay of the monaural reverberation sound signal by 100 msec. (step 107). This completes the operations of the delay circuits 4 and 5.

Then, the mixing circuits 6 and 7 appearing in FIG. 2, after the amplitudes of the two delayed monaural reverberation tone signals output from the delay circuits 4 and 5 being set to predetermined values corresponding to settings freely selected by the player, adds up selected combinations of resulting signals and the monaural reverberation tone signal to form two stereophonic tone signals to be delivered through the left and right channels 26 and 27 (Steps 108, 109). These steps will be described in detail below.

First, the operations of the amplitude control circuits 16 to 19 will be described. Out of data of the delayed monaural reverberation tone signal stored in predetermined locations of the data RAM 49 of the DSPb 51, a data piece as an output from the delayed circuit 4 is supplied to the multiplier 45, where the data piece is multiplied by a data piece of a coefficient read from the coefficient RAM 43 (corresponding to an amplitude control amount of the amplitude control circuit 16 selected by the player). This coefficient is not particularly limited, but in the present embodiment it is set to 1, which means that the data piece having the same amplitude as the delayed monaural reverberation tone signal is input to the mixing circuit 6. The multiplied data piece is transferred via the adder 46 to the buffer 47 for temporary storage therein. Then, a data piece as an output from the delayed circuit 5 is supplied to the multiplier 45, where the data piece is multiplied by a data piece of a coefficient read from the coefficient RAM 43 (corresponding to an amplitude control amount of the amplitude control circuit 19 selected by the player). This coefficient is not particularly limited, but in the present embodiment it is set to 0.2. The multiplied data piece and the data piece stored in the buffer 47 are added by the adder 46, and the sum is stored into the buffer 47 as a new data piece.

Similarly, the monaural reverberation tone signal is multiplied by a data piece of a coefficient (corresponding to an amplitude control amount of the amplitude control circuit 20) at the multiplier 45, and the product is delivered to the adder 46 to add same to the data piece read from the buffer 47. These signal-adding operations cause a plurality of different signals (i.e. signal components) to be present in a signal transmitted via the left channel 26. This completes the operation of the mixing circuit 6 (step 108). The mixing circuit 7 also performs a similar operation at a step 109. The signal data for the left and right channels 26, 27 are stored into the data RAM 49. Now, the mixing operations by the mixing circuits 6 and 7 are completed.

Thus, the mixing circuits 6 and 7 appearing in FIG. 2 can combine two delayed monaural reverberation tone signals and one monaural reverberation tone signal as desired, and at the same time, the amplitudes of these signals to be mixed can be set as desired.

Figure 5A:
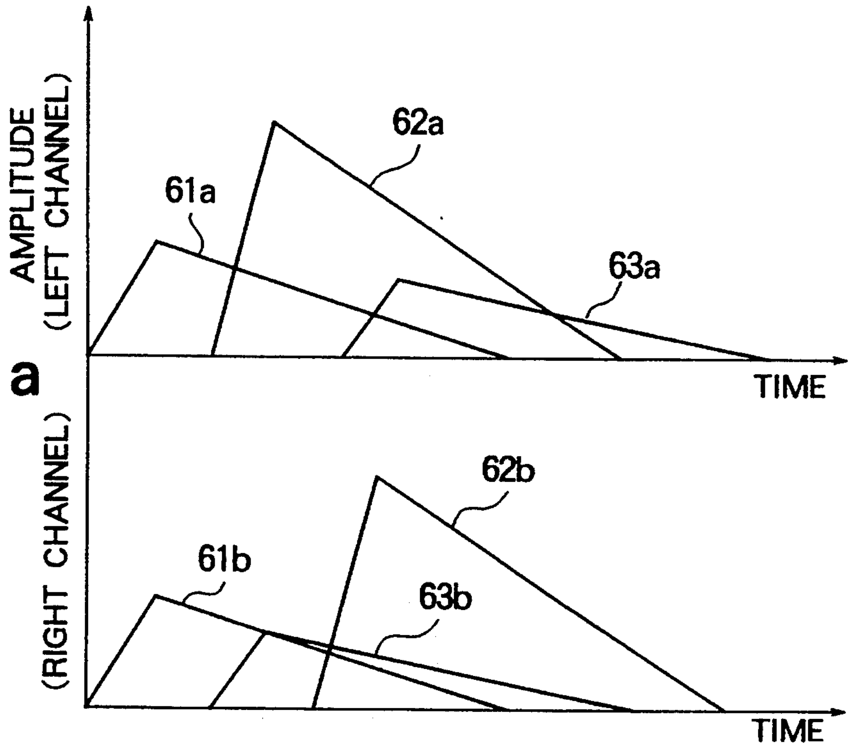
FIG. 5*a* is a waveform diagram showing an example of monaural reverberation tone signals and delayed monaural reverberation tone signals generated in the sound effect-creating of the preferred embodiment.

Next, a spread of a sound produced by the stereophonic signals of the left and right channels 26, 27 thus prepared will be described with reference to FIG. 5*a* to FIG. 5*c* and FIG. 6*a* to FIG. 6*c*. Figures shown in the upper and lower sections of FIG. 5*a* show, in a simplified manner, waveforms of components of the stereophonic signals (one of the left channel shown in the upper section and the other of the right channel shown in the lower section) including the delayed components output from the delay circuits 4 and 5. Reference numerals 61, 62 designate the monaural reverberation tone signals supplied to the mixing circuits 6 and 7 via the amplitude control circuits 20, respectively, while reference numerals 63, 64 designate the delayed monaural reverberation tone signals which are delayed by the delay circuits 4 and 8, and supplied to the mixing circuits 6 and 7 via the amplitude control circuits 16, 18, respectively. In the following description, however, there will be omitted description of the feedback components of the delayed monaural reverberation tone signals formed by the amplitude control circuits 14, 22, and 23 and components of the delayed monaural reverberation tone signals added via the amplitude control circuits 17 and 19.

Figure 5B:
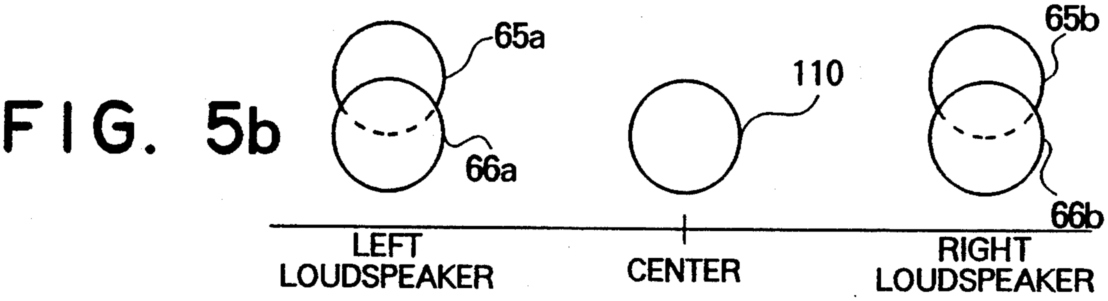
FIG. 5*b* is a diagram showing an example of the positional relationship between sound images resulting from the signals appearing in FIG. 5*a* and left and right loudspeakers.
Figure 5C:
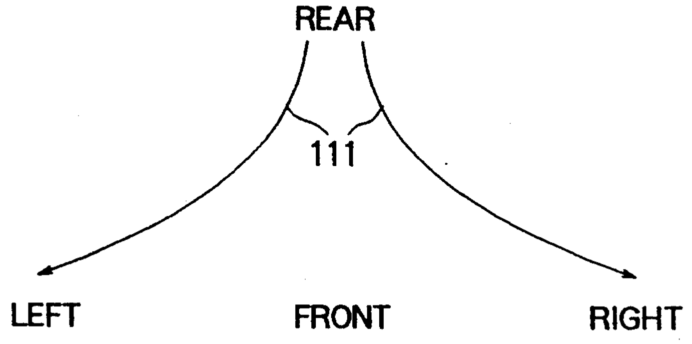
FIG. 5*c* is a diagram showing an example of a manner of spread of a sound realized by the sound effect-creating device of the preferred embodiment.

FIG. 5*b* shows locations of sound images produced by the stereophonic signals of the left and right channels 26 and 27, which are supplied, after being converted into respective analog signals, to the left and right loudspeakers, relative to the locations of the loudspeakers. According to the figure, a sound image 68 produced from the monaural reverberation tone signals 61 and 62 is localized to a central position between the left and right loudspeakers, since they are of an identical phase and amplitude. On the other hand, sound images 66 and 67 produced from the delayed monaural reverberation tones 63 and 64 are localized to respective locations of the left and right loudspeakers, since they are of different phases and hence timewise separated. Therefore, by setting the delay amounts of the delay circuits 4 and 8 to sufficiently large values, first, the monaural reverberation tone is heard from the location of the sound image 65, and then tile delayed monaural reverberation tones are heard from the locations of the left and right loudspeakers, respectively. As a result, the total sound produced from the speakers gives an sound image 68 which comes out from the rear of the center between the left and right loudspeakers to the front as shown in FIG. 5*c*, producing a diversified spread of the sound.

In addition, to make uniform the amplitudes of the delayed monaural reverberation tones at the locations of the left and right loudspeakers and the amplitude of the monaural reverberation tone at the center of the loudspeakers, it is only required, for example, that the coefficients corresponding to the control amounts of the amplitude control circuits 20, 21 are set to a value of 0.5, and those corresponding to the control amounts of the amplitude control circuits 16 and 18 being set to 0.8 to 1.0, those corresponding to the control amounts of the amplitude control circuits 17 and 19 being set to 0.2 to 0.0, provided that the sum of the coefficients for the amplitude control circuits 16 and 17, and the sum of those for the amplitude control circuits 18 and 19 are each equal to 1.0. In this connection, the numerical values of the coefficients mentioned above are absolute values of the actual coefficients. That is, an actual coefficient of −0.2, for example, is taken as 0.2 in the above explanation.

Figure 6A:
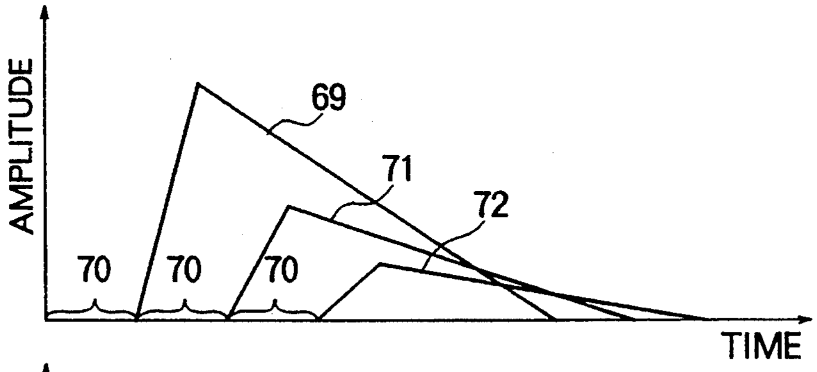
FIG. 6*a* is a waveform diagram which is useful in explaining waveforms of components of a delayed monaural reverberation tone signal.
Figure 6B:
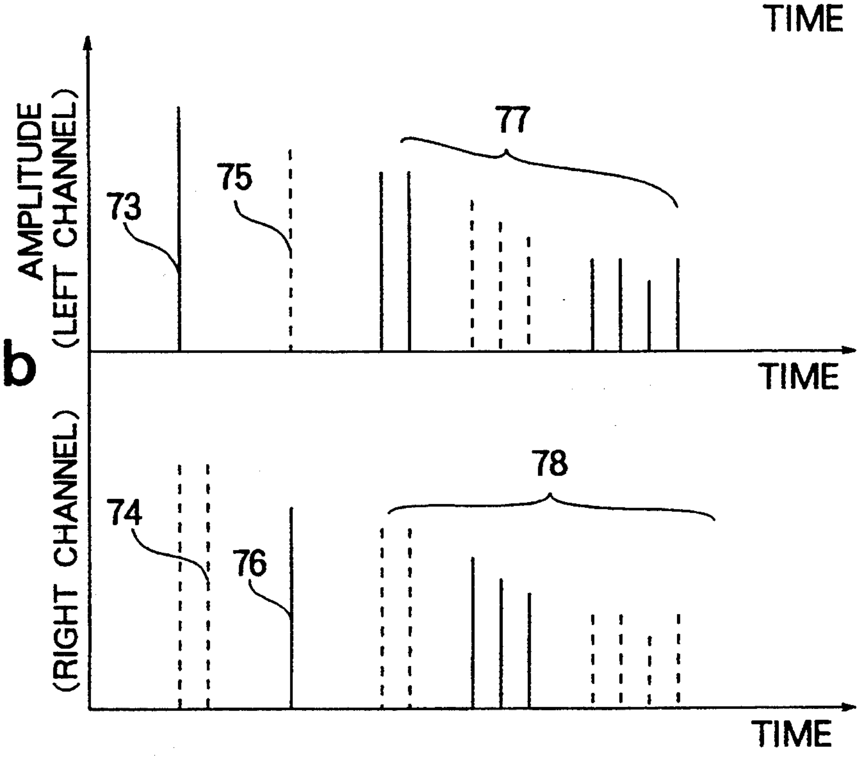
FIG. 6*b* is a diagram which is useful in explaining impulse response of delay circuits.
Figure 6C:
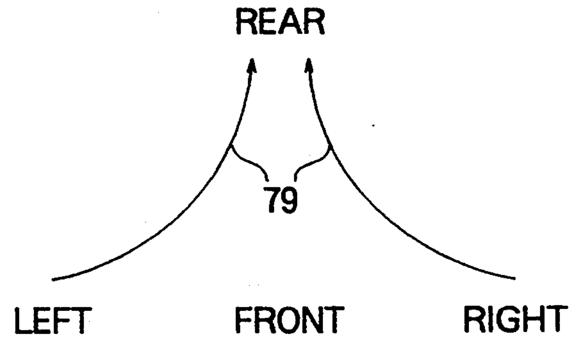
FIG. 6*c* is a diagram showing an example of convergence of a sound obtained by the sound effect-creating device of the preferred embodiment.
Figure 7A:
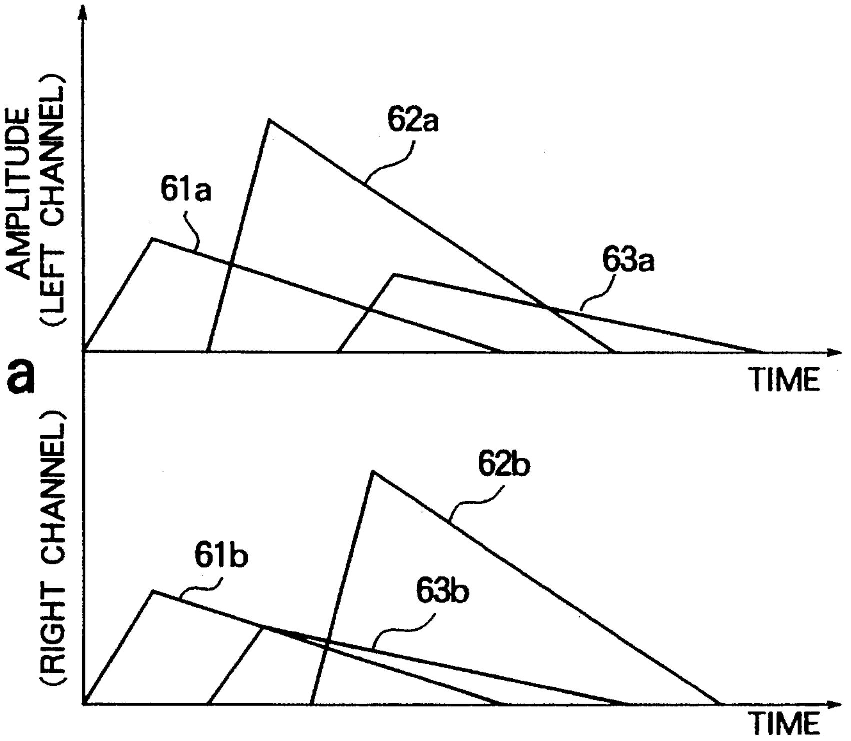
FIG. 7*a* is a waveform diagram showing another example of monaural reverberation tone signals and delayed monaural reverberation tone signals generated in the sound effect-creating of the preferred embodiment.
Figure 7B:
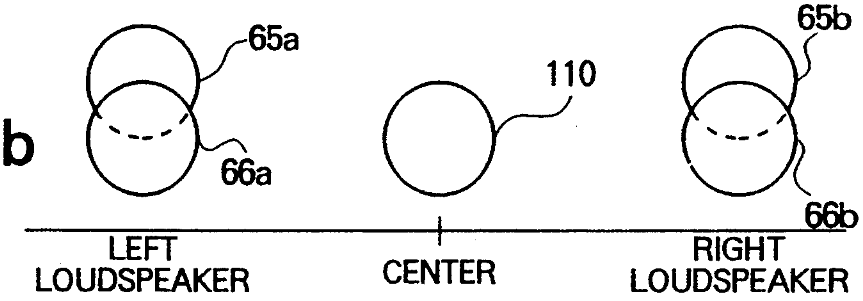
FIG. 7*b* is a diagram showing an example of the positional relationship between sound images resulting from the signals appearing in FIG. 7*a* and the left and right loudspeakers.
Figure 7C:
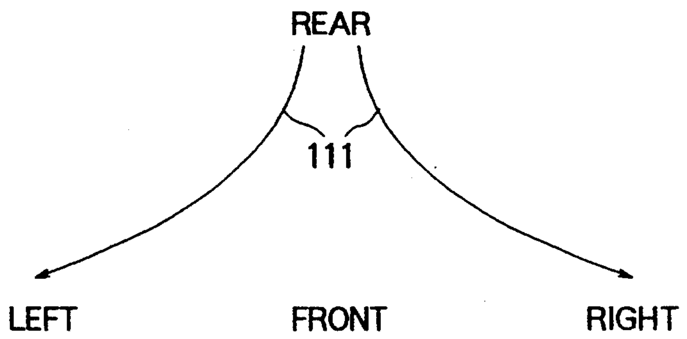
FIG. 7*c* is a diagram, similar to FIG. 5*c*, showing another example of a manner of spread of a sound realized by the sound effect-creating device of the preferred embodiment.

Then, how the reverberation changes due to the feedback of the outputs from the delay circuits 4 and 5 via the amplitude control circuits 14 and 15 will be described with reference to FIG. 6*a* to FIG. 6*c*. FIG. 6*a* shows waveforms of the delayed monaural reverberation tone signal and the feedback portions thereof, in a simplified manner. In the figure, reference numeral 69 designates the delayed monaural reverberation tone signal which is delayed by a delay time 70. Further, reference numerals 71 and 72 designate waveforms of signal components prepared by setting the amplitudes of the delayed monaural reverberation tone signal 69 to predetermined levels by the amplitude control circuits 14 and 15, and supplying the resulting signals to the delay circuits 4 and 5 in a feedback manner for delay by each delay amount 70. These delayed monaural reverberation tone signals 69, 71, and 72 are added up, so that the thickness of the reverberation increases with the lapse of time, which varies the reverberation of the sound.

Then, how the spread of the reverberation sound varies due to the feedback of the signals via the amplitude control circuits 22, 23 will be described with reference to FIG. 6*b*. This figure shows the impulse response of the delay circuits 4 and 5. When a pulse having a very short duration is input to the delay circuits 4 and 5, pulses 73 and 74 are output therefrom after the lapse of delay times, respectively. The output from the delay circuit 4 is supplied to the delay circuit 5 in a feedback manner, and similarly, that from the delay circuit 5 to the delay circuit 4, so that pulses 75 and 76 are delivered from the delay circuits 4 and 5 respectively Similarly after the lapse of the delay time, pulses 77 and 78 are delivered therefrom.

As can be understood from the figures, first, the pulses 73 and 74 are delivered after the lapse of the delay times set to the delay circuits 4 and 5, but with the lapse of time, the signals are influenced by each other in a repeated manner at intervals corresponding to the difference in the delays times set to the delay circuits 4 and 5, resulting in a gradually converging output. In other words, at first, the two delayed monaural reverberation signals are separate from each other due to different phases thereof, but with the lapse of-time, the phases come to overlap each other to cause the signals to cease to be separate from each .other. This provides a sound image 79 which gives an impression that the originally expanded sound is drawn into the rear of the center between the left and right loudspeakers, varying the spread of the sound produced.

Then, there will be described a case in which the amplitude control amounts, i.e. the coefficients, for the amplitude control circuits 17 and 19 are each set to −0.2, and the inverted-phase delayed monaural reverberation tone signals which are inverted in the sign of a value of amplitude of the delayed monaural reverberation tone signal are supplied to the mixing circuits 6 and 7. The control amounts of the other amplitude control circuits are assumed to be identical to those in the above described case.

A data piece as the output from the delay circuit 5 is delivered to the multiplier 45, where it is multiplied by a data piece of a coefficient (−0.2). The multiplied data piece is added up with the data piece read from the buffer 47 (which corresponds to the signal supplied from the delay circuit 4 via the amplitude control circuit 16 to the mixing circuit 6), and the sum is stored into the buffer 47 as an updated data piece.

Then, the amplitude control circuits 20 and 21 operate in the same manner as describe above, and hence the monaural reverberation tone signal is multiplied by a coefficient, and the resulting signal is added to the data piece read from the buffer 47. The signals for the left and right channels 26 and 27 prepared in this manner are stored into the data RAM 49. This completes the mixing operations of the mixing circuits 6 and 7 (step 108, 109 in FIG. 4), and causes a plurality of signals of different kinds of sounds to be present in the signals transmitted through the left and right channels 26 and 27.

Thus, the mixing circuits 6 and 7 appearing in FIG. 2 can combine two delayed monaural reverberation tone signals and one monaural reverberation tone signal as desired, and at the same time, the amplitudes of these signals as well as the sign of values thereof to be mixed can be set as desired.

Next, the spread, reverberation, and thickness of the sound produced by the stereophonic signals of the left and right channels 26, 27 thus prepared will be described with reference to FIG. *7a* to FIG. *7c*. Figures shown in the upper and lower sections of FIG. *7a* show, in a simplified manner, waveforms of components of the stereophonic signals including the delayed components output from the delay circuits 4 and 5. Reference numerals 61*a*, 61*b* designate the monaural reverberation tone signals supplied to the mixing circuits 6 and 7 via the amplitude control circuits 20, 21, respectively, while reference numerals 62*a*, 62*b* designate the delayed monaural reverberation tone signals which are delayed by the delay circuits 4 and 5, and supplied to the mixing circuits 6 and 7 via the amplitude control circuits 16, 18, respectively.

Further, reference numerals 63*a* and 63*b* designate inverted-phase delayed monaural reverberation tone signals supplied to the mixing circuits 6 and 7, which are prepared by inverting the sign of a value of amplitude of the delayed monaural reverberation tone signal by the use of the amplitude control circuits 19 and 17. These inverted-phase delayed monaural reverberation tone signals 63*a* and 63*b* bear the relationship to the delayed monaural reverberation tone signals 62*a* and 62*b*, which results from the control amounts (data of coefficients) for the amplitude control circuits 19 and 17, such that the sign of values of the amplitude of signals is inverted and has an amplitude of one fifth of the amplitude of the signals 62*a* and 62*b*.

FIG. *7b* shows locations of sound images produced by the stereophonic signals of the left and right channels 26 and 27, which are supplied, after being converted into respective analog signals, to the left and right loudspeakers, relative to the locations of the loud speakers. As is clearly shown therein, a sound image 110 produced from the monaural reverberation tone signals 61*a* and 61*b* is localized to a central position between the left and right loudspeakers, since they are of an identical phase and amplitude. On the other hand, sound images 65*a* and 65*b* produced from the delayed monaural reverberation tones 62*a* and 62b are localized to respective locations of the left and right loudspeakers, since they are of different phases and hence timewise separated.

Further, the inverted-phase delayed monaural reverberation tone signals 63*a* and 63*b* are different in phase due to inversion of the sign of a value of amplitude, and are timewise separated from the delayed monaural reverberation tone signals 62*a* and 62*b*. Therefore, sound images 66*a* and 66*b* corresponding thereto are heard from the locations of the left and right loudspeakers, separately. Therefore, by setting the delay amounts of the delay circuits 4 and 5 to sufficiently large values, first, the monaural reverberation tone is heard from the location of the sound image 110, and then the delayed monaural reverberation tones are heard from the locations of the sound images 65*a* and 65*b* at the left and right speakers, respectively, while the inverted-phase delayed monaural reverberation tones being heard from the locations of the sound images 66*a* and 66*b* at the left and right loudspeakers, respectively. As a result, the total sound produced from the speakers gives an sound image 111 which comes out from the rear of the center between the left and right loudspeakers to the front as shown in FIG. *7c*, producing a diversified spread of the sound. Further, the presence of the five different sound images acting on the hearing of a listener contributes to increasing the sense of thickness of the sound.

Further, in this example of settings of the amplitude control amounts, the amplitude control circuits 17 and 19 prepare the inverted-phase delayed monaural reverberation tone signals from the delayed monaural reverberation tone signals, which increase the thickness of the sound.

Further, the left and right loudspeakers generate the sounds (or sound components) corresponding to the delayed monaural reverberation tone signals and the sounds (or sound components) corresponding to the inverted-phase delayed monaural reverberation tone signals which are inverted in phase relative to the delayed monaural reverberation tone signals, which cancel the undesirable overtones to eliminate undesirable characteristics of the sound, contributing to generation of a natural sound.

As described heretofore, according to the present embodiment, the monaural original tone signal-mixing circuit 2 forms the stereophonic signals into the monaural original tone signal. Then, the reverberation circuit 3 adds reverberation to the monaural original tone signal, and the delay circuits 4 and 5 delay the resulting signals. The mixing circuits 6 and 7 mixes respective combinations of various kinds and modifications of signals thus prepared. These operations of the sound effect-creating device provides the sense of the spread of the sound. Further, the feedback of the delayed monaural reverberation tone signals to the delay circuits 4 and 5 varies the spread and reverberation of the sound with the lapse of time. Further, the amplitude control circuits 10 to 21 allow the amplitudes of signals input to the reverberation circuit 3, the delay circuits 4 and 5, and the mixing circuits 6 and 7, as desired, which contributes to diversified variation in the reverberation, spread, and thickness of the sound.

Further, it is to be understood that the present invention is not limited to the preferred embodiment described above. For example, the number of DSP's is not limited to two, but more than two DSP's or only one DSP may be used. Further, various changes and modifications may be made to details of control of the DSP's without departing from the scope of the present invention.

What is claimed is:

1. A sound effect-creating device for imparting a sound effect to a sound, comprising:

a reverberation circuit for adding a reverberation tone signal to a monaural original tone signal to generate a monaural reverberation tone signal;

a plurality of delay circuits, each having an input coupled to receive said monaural reverberation tone signal, said delay circuits delaying said monaural reverberation tone signal output from said reverberation circuit by respective different delay amounts to generate a plurality of delayed monaural reverberation tone signals at respective outputs of said plurality of delay circuits; and a plurality of mixing circuits, each being coupled to add at least one of said delayed monaural reverberation tone signals to said monaural reverberation tone signal;

wherein the output of each of said plurality of delay circuits is coupled to each of the respective inputs of said plurality of delay circuits, whereby a delayed monaural reverberation tone signal generated by each of said plurality of delay circuits is provided as an input to each of said plurality of delay circuits.

2. A sound effect-creating device according to claim 1, wherein each of said plurality of mixing circuits each has a plurality of amplitude control circuits for controlling amplitudes of said delayed monaural reverberation tone signals input thereto, respectively.

3. A sound effect-creating device according to claim 1, wherein said reverberation circuit has a monaural original tone signal-mixing circuit arranged at an input block thereof for adding up original tone signals of a plurality of channels to form said monaural original tone signal.

4. A sound effect-creating device according to claim 2, wherein said reverberation circuit has a monaural original tone signal-mixing circuit arranged at an input block thereof for adding up original tone signals of a plurality of channels to form said monaural original tone signal.

5. A sound effect-creating device according to claim 3, wherein said monaural original tone signal-mixing circuit has a plurality of amplitude control circuits for controlling the amplitude of each of said original tone signals of said plurality of channels.

6. A sound effect-creating device according to claim 4, wherein said monaural original tone signal-mixing circuit has a plurality of amplitude control circuits for controlling the amplitude of each of said original tone signals of said plurality of channels.

7. A sound effect-creating device according to claim 1, wherein at least one of said plurality of mixing circuits inverts a sign of a value of amplitude of at least one of said delayed monaural reverberation tone signals, and adds a the resulting signal to said monaural reverberation tone signal.

8. A sound effect-creating device according to claim 3, wherein at least one of said plurality of mixing circuits inverts a sign of a value of amplitude of at least one of said delayed monaural reverberation tone signals, and adds a resulting signal to said monaural reverberation tone signal.

9. A sound effect-creating device according to claim 5, wherein at least one of said plurality of mixing circuits inverts a sign of a value of amplitude of at least one of said delayed monaural reverberation tone signals, and adds a resulting signal to said monaural reverberation tone signal.

10. A sound effect-creating device according to claim 2, wherein at least one of said plurality of amplitude control circuits of said plurality of mixing circuits inverts a sign of a value of amplitude of said delayed reverberation tone signal input thereto, and delivers a resulting signal to one of said plurality of mixing circuit associated therewith.

11. A sound effect-creating device according to claim 4, wherein at least one of said plurality of amplitude control circuits of said plurality of mixing circuits inverts the sign of a value of amplitude of said delayed reverberation tone signal input thereto, and delivers a resulting signal to one of said plurality of mixing circuits associated therewith.

12. A sound effect-creating device according to claim 6, wherein at least one of said plurality of amplitude control circuits of said plurality of mixing circuits inverts a sign of a value of amplitude of said delayed reverberation tone signal input thereto, and delivers a resulting signal to one of said plurality of mixing circuits associated.

13. A sound effect-creating device for imparting a sound effect to a sound, comprising:

a reverberation circuit for adding a reverberation tone signal to a monaural original tone signal to generate a monaural reverberation tone signal;

a plurality of delay circuits, each having an input coupled to receive said monaural reverberation tone signal, said delay circuits delaying said monaural reverberation tone signal output from said reverberation circuit by respective different delay amounts to generate a plurality of delayed monaural reverberation tone signals at respective outputs of said plurality of delay circuits; and a plurality of mixing circuits, each being coupled to add at least one of said delayed monaural reverberation tone signals to said monaural reverberation tone signal;

wherein the outputs of at least some of said plurality of delay circuits are coupled to the respective inputs of at least some others of said plurality of delay circuits, whereby delayed monaural reverberation tone signals generated by at least some of said plurality of delay circuits are provided as an input to at least some others of said plurality of delay circuits.

14. A sound effect-creating device according to claim 13, wherein each of said plurality of mixing circuits has a plurality of amplitude control circuits for controlling amplitudes of said delayed monaural reverberation tone signals input thereto, respectively.

15. A sound effect-creating device according to claim 13, wherein said reverberation circuit has a monaural original tone signal-mixing circuit arranged at an input block thereof for adding up original tone signals of a plurality of channels to form said monaural original tone signal.

16. A sound effect-creating device according to claim 13, wherein at least one of said plurality of mixing circuits inverts a sign of a value of amplitude of at least one of said delayed monaural reverberation tone signals, and adds a resulting signal to said monaural reverberation tone signal.

17. A sound effect-creating device according to claim 14, wherein at least one of said plurality of amplitude control circuits of said plurality of mixing circuits inverts a sign of a value of amplitude of said delayed reverberation tone signal input thereto, and delivers a resulting signal to one of said plurality of mixing circuits associated therewith.

* * * * *